United States Patent
Harada et al.

(10) Patent No.: US 7,851,871 B2
(45) Date of Patent: Dec. 14, 2010

(54) SEMICONDUCTOR DEVICE AND METHOD FOR FABRICATING THE SAME

(75) Inventors: Yuji Harada, Hyogo (JP); Kazuyuki Sawada, Toyama (JP); Masahiko Niwayama, Kyoto (JP); Masaaki Okita, Toyama (JP)

(73) Assignee: Panasonic Corporation, Osaka (JP)

( * ) Notice: Subject to any disclaimer, the term of this patent is extended or adjusted under 35 U.S.C. 154(b) by 261 days.

(21) Appl. No.: 12/242,142

(22) Filed: Sep. 30, 2008

(65) Prior Publication Data
US 2009/0090978 A1 Apr. 9, 2009

(30) Foreign Application Priority Data
Oct. 3, 2007 (JP) .............................. 2007-259871

(51) Int. Cl.
*H01L 29/768* (2006.01)
(52) U.S. Cl. ............... 257/392; 257/369; 257/E27.062; 257/E27.065
(58) Field of Classification Search ................. 257/369, 257/392, E27.062, E27.065
See application file for complete search history.

(56) References Cited
U.S. PATENT DOCUMENTS

| | | | |
|---|---|---|---|
| 4,394,674 A | 7/1983 | Sakuma et al. | |
| 4,818,719 A * | 4/1989 | Yeh et al. ...................... | 438/200 |
| 5,128,823 A * | 7/1992 | Fujimoto et al. ........... | 361/93.9 |
| 6,017,797 A * | 1/2000 | Furukawa .................... | 438/275 |
| 6,137,140 A * | 10/2000 | Efland et al. ................. | 257/343 |
| 6,198,131 B1 * | 3/2001 | Tung ........................... | 257/345 |
| 6,222,235 B1 * | 4/2001 | Kojima et al. ............... | 257/355 |
| 7,282,410 B2 | 10/2007 | Lu et al. | |
| 2001/0025961 A1 | 10/2001 | Nakamura et al. | |
| 2002/0047176 A1 * | 4/2002 | Takahashi .................... | 257/448 |
| 2004/0108544 A1 | 6/2004 | Hossain et al. | |
| 2009/0194815 A1 * | 8/2009 | Choi et al. ................... | 257/338 |

* cited by examiner

Primary Examiner—Allan R Wilson
(74) Attorney, Agent, or Firm—McDermott Will & Emery LLP (57) ABSTRACT

A high-voltage transistor and a peripheral circuit including a second conductivity type MOSFET are provided together on a first conductivity type semiconductor substrate. The high-voltage transistor includes: a low concentration drain region of a second conductivity type formed in the semiconductor substrate; a low concentration source region of a second conductivity type formed in the semiconductor substrate and spaced apart from the low concentration drain region; and a high concentration source region of a second conductivity type having a diffusion depth deeper than that of the low concentration source region. A diffusion depth of the low concentration source region is equal to that of source/drain regions of the MOSFET.

2 Claims, 9 Drawing Sheets

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2007-259871 filed in Japan on Oct. 3, 2007, the entire contents of which are hereby incorporated by reference.

BACKGROUND OF THE INVENTION

1. Field of the Invention

The present invention relates to a semiconductor device in which a high-voltage MOS transistor and a peripheral circuit are provided together and to a method for fabricating the same.

2. Description of the Prior Art

Figure 8A:
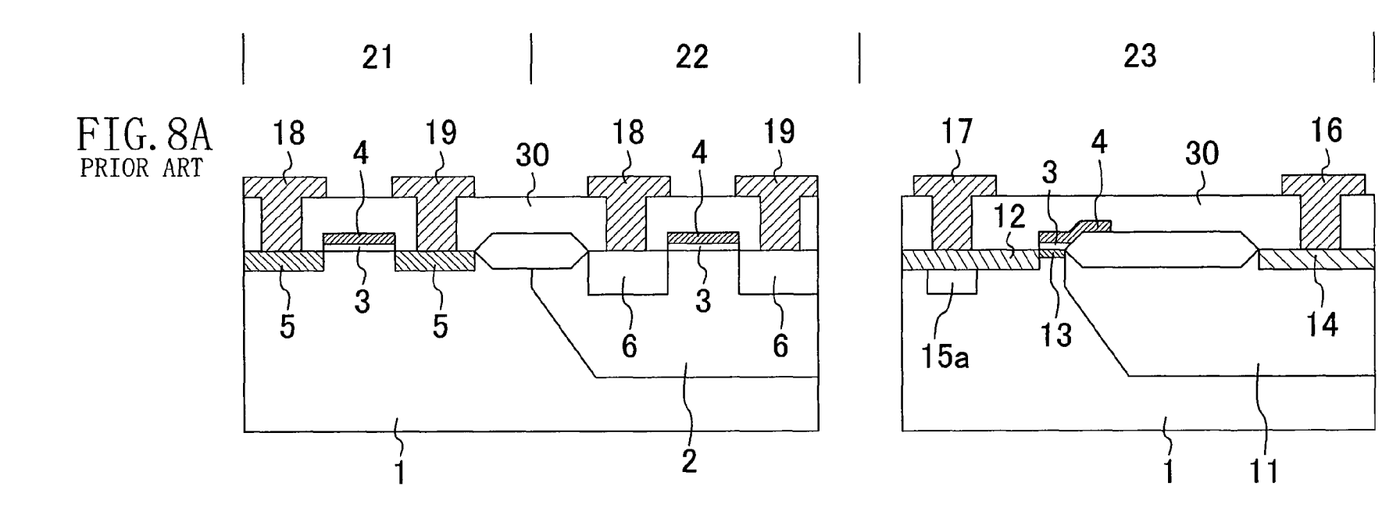
FIG. 8 shows cross sections of a conventional semiconductor device.
Figure 8B:
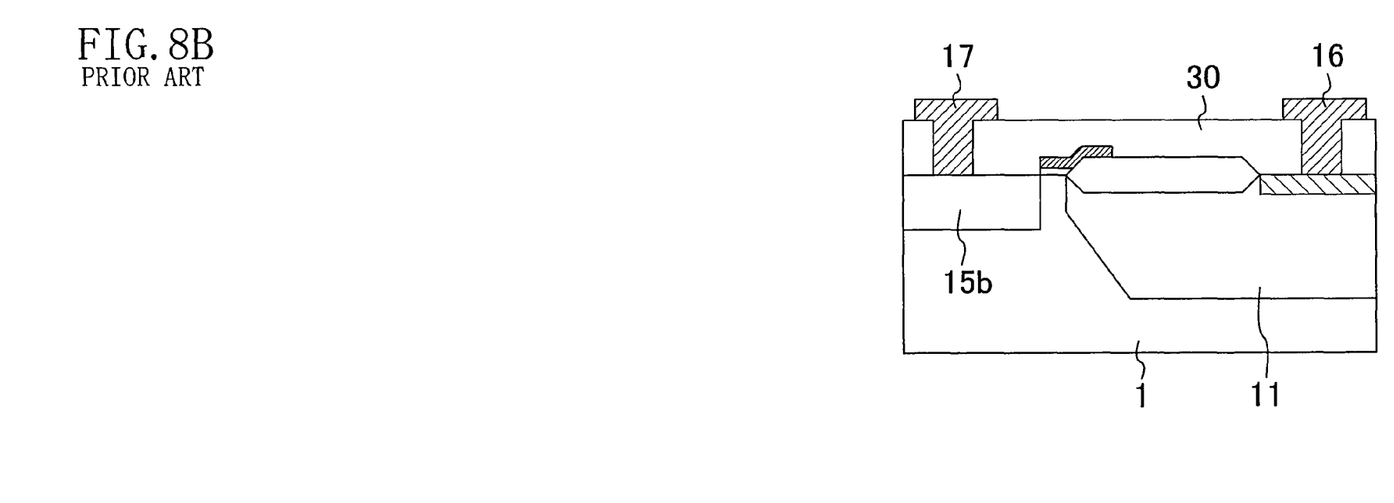
Figure 9:
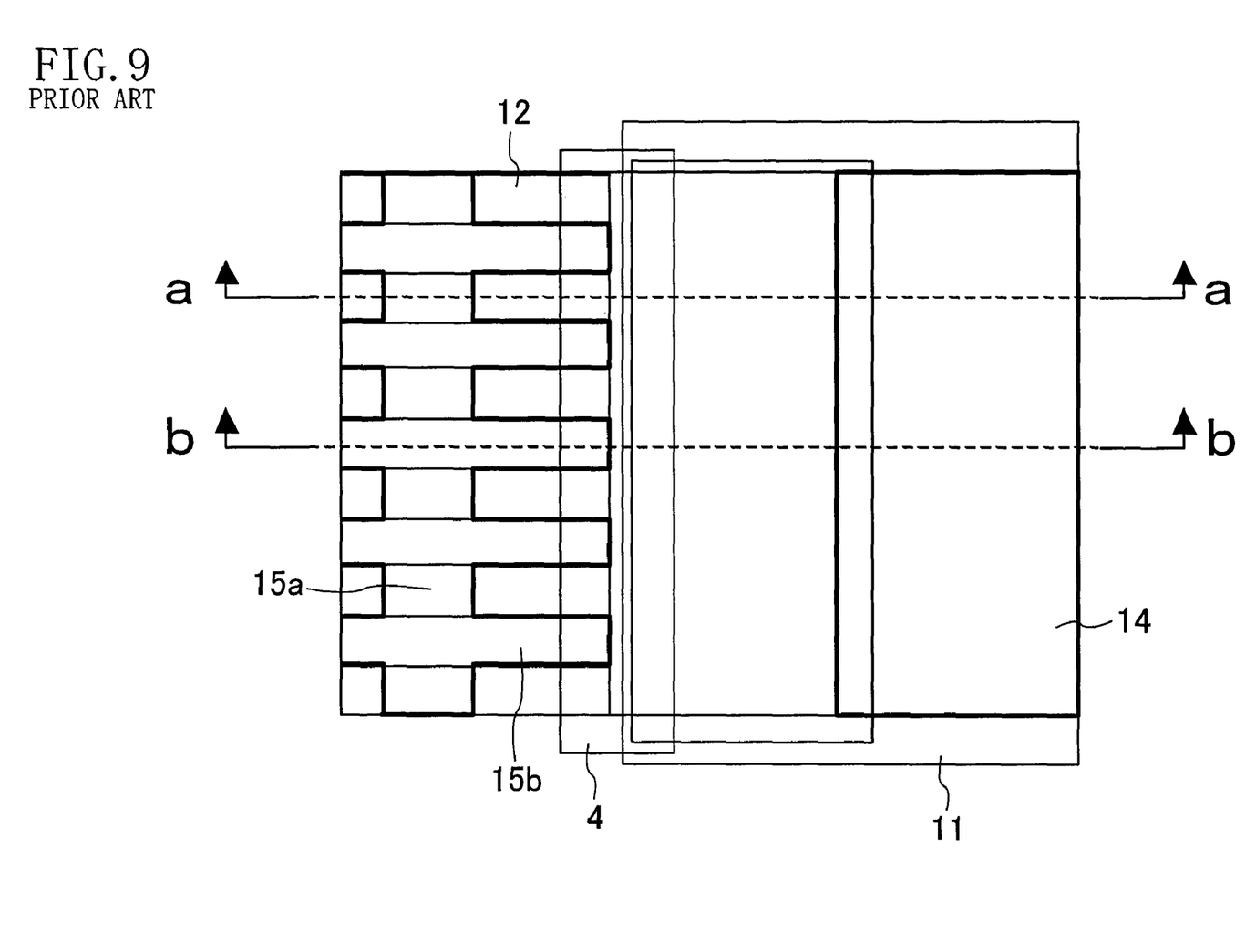
FIG. 9 is a plan view of a lateral high-voltage MOS transistor of the conventional semiconductor device.

FIG. 8A and FIG. 8B show cross sections of a conventional semiconductor device in which a lateral high-voltage MOS transistor and a peripheral circuit are provided together. FIG. 8A is a cross section of a lateral high-voltage MOS transistor region 23, taken along the line a-a of FIG. 9 showing a plan view of a lateral high-voltage MOS transistor of conventional type. FIG. 8B is a cross section taken along the line b-b of FIG. 9. A source electrode, a source contact, a drain electrode, and a drain contact are not shown in FIG. 9.

In the conventional semiconductor device, as shown in the left drawing of FIG. 8A, an N well region 2 exists in a P-type silicon substrate 1 of a P-type MOS region 22. A gate insulating film 3 is provided on each of the P-type silicon substrate 1 and the N well region 2. A gate electrode 4 is provided on the respective gate insulating films 3. N-type source/drain regions 5 exist in the P-type silicon substrate 1 on both sides of the gate electrode 4 of the N-type MOS region 21. P-type source/drain regions 6 exist in the N well region 2 on both sides of the gate electrode 4 of the P-type MOS region 22.

Further, as shown in the right drawing of FIG. 8A, an N-type low concentration drain region 11 and an N-type source region 12, spaced apart from each other, exist in a P-type silicon substrate 1 of a lateral high-voltage MOS transistor region 23. A channel region 13 is provided in the substrate surface between the N-type low concentration drain region 11 and the N-type source region 12. A gate insulating film 3 is provided on the channel region 13, and a gate electrode 4 is provided on the gate insulating film 3. An N-type high concentration drain region 14 exists in the N-type low concentration drain region 11. A P-type substrate contact region 15a is provided under the N-type source region 12 and spaced apart from the gate electrode 4.

The cross section of FIG. 8B taken along the line b-b of FIG. 9 shows that a P-type substrate contact region 15b, spaced apart from the N-type low concentration drain region 11, is provided in the P-type silicon substrate 1.

An interlayer insulating film 30 is provided on the P-type silicon substrate 1 of the N-type MOS region 21, P-type MOS region 22, and lateral high-voltage MOS transistor region 23 as shown in FIG. 8A and FIG. 8B. Part of the interlayer insulating film 30 on the N-type high concentration drain region 14 of the lateral high-voltage MOS transistor region 23 has an opening, in which a drain electrode 16 is formed to connect the N-type high concentration drain region 14 with an external device via the opening. Parts of the interlayer insulating film 30 on the N-type source region 12 and the P-type substrate contact region 15b have openings, too, in each of which a source electrode 17 is formed to connect the N-type source region 12 and the P-type substrate contact region 15b with an external device via the opening. Parts of the interlayer insulating film 30 formed on the source/drain regions of the N-type MOS region 21 and the P-type MOS region 22 have openings, too, and a drain electrode 18 or a source electrode 19 is formed in a corresponding one of the openings.

In the fabrication of the semiconductor device, the N-type source/drain regions 5 of the N-type MOS region 21 and the N-type source region 12 of the lateral high-voltage MOS transistor region 23 are formed in the same step. The P-type source/drain regions 6 of the P-type MOS region 22 and the P-type substrate contact regions 15a and 15b of the lateral high-voltage MOS transistor region 23 are formed in the same step.

SUMMARY OF THE INVENTION

In the above conventional semiconductor device, however, a problem of punch-through arises in both of the N-type MOS region and the P-type MOS region because of reduction in a gate length when shrink of the peripheral circuit is attempted.

If the N-type source/drain regions 5 of the N-type MOS region 21 are formed to have a shallow diffusion depth to suppress the punch-through, the N-type source region 12 of the lateral high-voltage MOS transistor region 23 will have a shallow diffusion depth, too, since formed in the same step. This leads to an increase in diffusion resistance, and as a result, on-resistance of the lateral high-voltage MOS transistor increases.

If the P-type source/drain regions 6 of the P-type MOS region 22 are formed to have a shallow diffusion depth to suppress the punch-through, the P-type substrate contact regions 15a and 15b of the lateral high-voltage MOS transistor region 23 will have a shallow diffusion depth, too, since formed in the same step. If the diffusion depth of the P-type substrate contact regions 15a and 15b is shallower than the diffusion depth of the N-type source region 12 of the lateral high-voltage MOS transistor region 23, the P-type substrate contact region 15a will not be formed under the N-type source region 12. In this case, the substrate resistance under the N-type source region 12 increases and a lateral parasitic bipolar transistor having the N-type low concentration drain region 11 as a collector, the P-type silicon substrate 1 as a base, and the N-type source region 12 as an emitter is easily turned on. As a result, ESD (electro static discharge) tolerance and latch-up tolerance are lowered.

A solution to these problems may be that the N-type source/drain regions 5 of the N-type MOS region 21, the P-type source/drain regions 6 of the P-type MOS region 22, the N-type source region 12 of the lateral high-voltage MOS transistor region 23, and the P-type substrate contact regions 15a and 15b of the lateral high-voltage MOS transistor region 23 are formed separately in different steps. However, four mask steps will be necessary to achieve this, which results in increase in costs.

In view of the above, an object of the present invention is to provide, at a low cost, a semiconductor device in which a peripheral circuit and a lateral high-voltage transistor capable of suppressing the increase in on-resistance and having high ESD tolerance and latch-up tolerance are provided together.

To solve the above problems, the first modification of the present invention provides a semiconductor device including a first conductivity type semiconductor substrate, a high-voltage transistor and a peripheral circuit which includes a second conductivity type MOSFET, the high-voltage transistor and the peripheral circuit being provided together on the first conductivity type semiconductor substrate, wherein the high-voltage transistor includes: a low concentration drain region of a second conductivity type formed in the semiconductor substrate; a low concentration source region of a second conductivity type formed in the semiconductor substrate and spaced apart from the low concentration drain region; a high concentration source region of a second conductivity type formed in part of the semiconductor substrate that is between the low concentration drain region and the low concentration source region, the high concentration source region being spaced apart from the low concentration drain region and adjacent to the low concentration source region and having a diffusion depth deeper than that of the low concentration source region; a gate electrode formed above the semiconductor substrate between the low concentration drain region and the high concentration source region so as to be insulated from the semiconductor substrate; a high concentration drain region of a second conductivity type formed in the low concentration drain region; a drain electrode formed on the semiconductor substrate so as to connect to the high concentration drain region; a substrate contact region of a first conductivity type formed so as to be at least in contact with a lower interface of the low concentration source region; and a source electrode formed on the semiconductor substrate so as to connect to the low concentration source region, and wherein a diffusion depth of the low concentration source region is equal to that of source/drain regions of the MOSFET.

According to the above first modification, the low concentration source region has the same diffusion depth as that of the source/drain regions of the MOSFET. Hence, the low concentration source region and the source/drain regions of the MOSFET can be formed in the same step. As a result, increase in the process cost can be suppressed. If the source/drain regions of the MOSFET are formed to have a shallow diffusion depth to suppress punch-through, in other words, if the second conductivity type MOSFET is shrunk, the low concentration source region will have a shallow diffusion depth, too. However, increase in on-resistance of the high-voltage transistor can be suppressed by adjusting the impurity concentration and diffusion depth of the high concentration source region having a deeper diffusion depth than the low concentration source region.

In addition, since a substrate contact region is located under the low concentration source region, increase in substrate resistance is suppressed and the ESD tolerance and latch-up tolerance of the lateral high-voltage transistor are prevented from being lowered.

The second modification of the present invention is the semiconductor device of the first modification, wherein the peripheral circuit further includes a first conductivity type MOSFET.

According to the above second modification, the substrate contact region and source/drain regions of the first conductivity type MOSFET can be formed in the same step. In this structure, punch-through can be suppressed by reducing a diffusion depth of the source/drain regions of the first conductivity type MOSFET within a range that does not make the diffusion depth of the substrate contact region shallower than that of the low concentration source region.

The third modification of the present invention offers a method for fabricating a semiconductor device including a first conductivity type semiconductor substrate, a high-voltage transistor and a peripheral circuit which includes a second conductivity type MOSFET, the high-voltage transistor and the peripheral circuit being provided together on the first conductivity type semiconductor substrate, the method including the steps of: (a) forming in the semiconductor substrate a low concentration drain region of a second conductivity type of the high-voltage transistor; (b) forming a gate insulating film on the semiconductor substrate; (c) forming a conductor layer on the gate insulating film; (d) forming a gate electrode by patterning the conductor layer; (e) forming a high concentration drain region of a second conductivity type in the low concentration drain region; (f) forming a high concentration source region of a second conductivity type in part of the semiconductor substrate such that the gate electrode exists between the high concentration drain region and the high concentration source region; (g) forming a low concentration source region of a second conductivity type so as to be adjacent to the high concentration source region and farther from the gate electrode than the high concentration source region, the low concentration source region having a diffusion depth shallower than that of the high concentration source region; (h) forming a substrate contact region so as to be at least in contact with a lower interface of the low concentration source region; and (i) forming source/drain regions of the MOSFET, wherein step (g) and step (i) are performed simultaneously.

According to the above third modification, step (g) and step (i) are performed simultaneously, which means that the source/drain regions of the MOSFET and the low concentration source region of the high-voltage transistor are formed in the same step. As a result, increase in the process cost can be suppressed. Further, each of the source/drain regions of the MOSFET and the low concentration source region has a diffusion depth equal to each other. If the source/drain regions of the MOSFET are formed to have a shallow diffusion depth to suppress punch-through, in other words, if the second conductivity type MOSFET is shrunk, the low concentration source region will have a shallow diffusion depth, too. However, increase in on-resistance of the high-voltage transistor can be suppressed by adjusting, in step (f), the impurity concentration and diffusion depth of the high concentration source region having a deeper diffusion depth than the low concentration source region.

In addition, since a substrate contact region is formed under the low concentration source region in step (h), increase in substrate resistance is suppressed and the ESD tolerance and latch-up tolerance of the high-voltage transistor are prevented from being lowered.

The fourth modification of the present invention is a method of the third modification, wherein the peripheral circuit further includes a first conductivity type MOSFET; the method further includes step (j) of forming source/drain regions of the first conductivity type MOSFET; and step (h) and step (j) are performed simultaneously.

According to the above fourth modification, step (h) and step (j) are performed simultaneously, which means that the substrate contact region and the source/drain regions of the first conductivity type MOSFET are formed in the same step. As a result, increase in the process cost can be suppressed. In this structure, punch-through can be suppressed by reducing a diffusion depth of the source/drain regions of the first conductivity type MOSFET within a range that does not make the diffusion depth of the substrate contact region shallower than that of the low concentration source region.

DETAILED DESCRIPTION OF THE INVENTION

An embodiment of the present invention will hereinafter be described with reference to the drawings.

Embodiment

FIG. 1 shows cross sections of a semiconductor device according to an embodiment of the present invention. FIG. 2 is a plan view of a lateral high-voltage MOS transistor according to this embodiment of the present invention.

In the semiconductor device according to the present embodiment, a lateral high-voltage MOS transistor and a peripheral circuit are provided together on a P-type (first conductivity type) semiconductor substrate (P-type silicon substrate) 101.

Figure 1A:
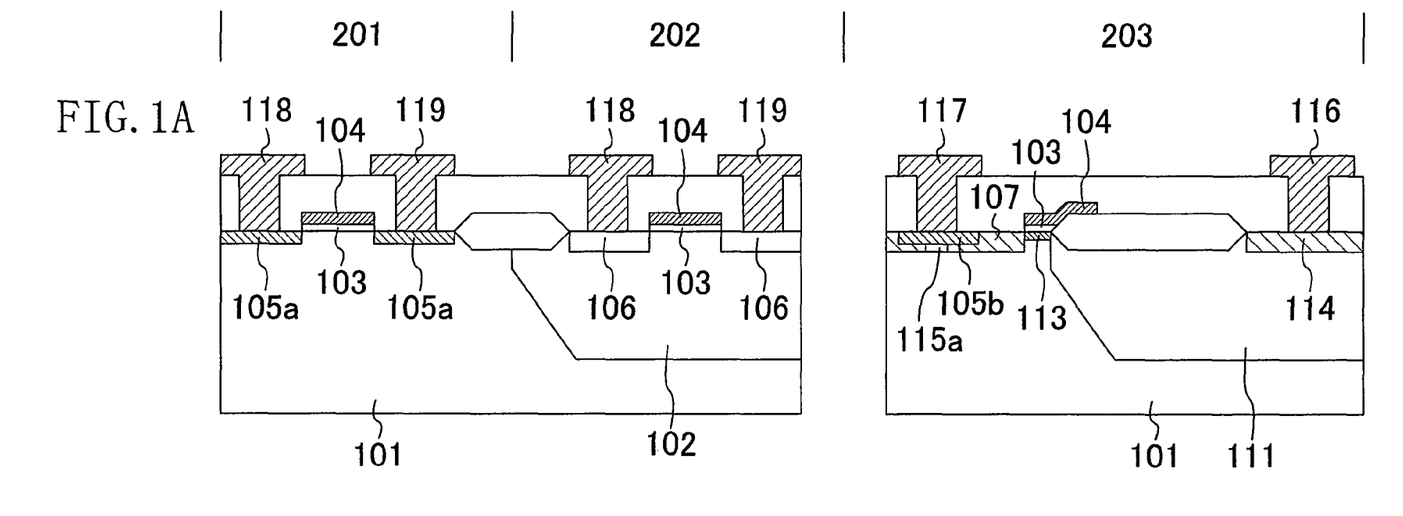
FIG. 1 shows cross sections of a semiconductor device according to an embodiment.
Figure 1B:
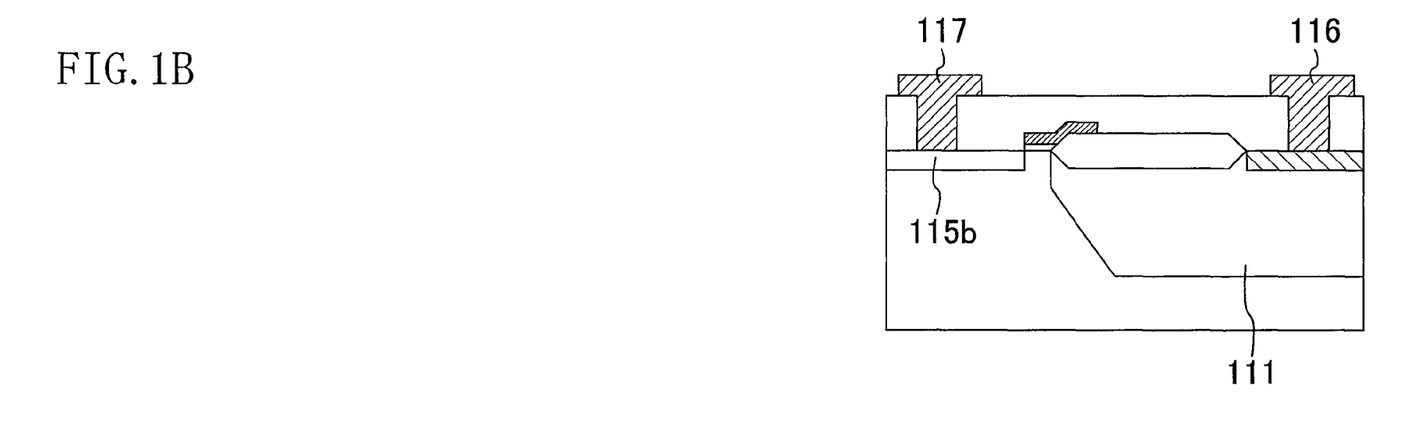
Figure 2:
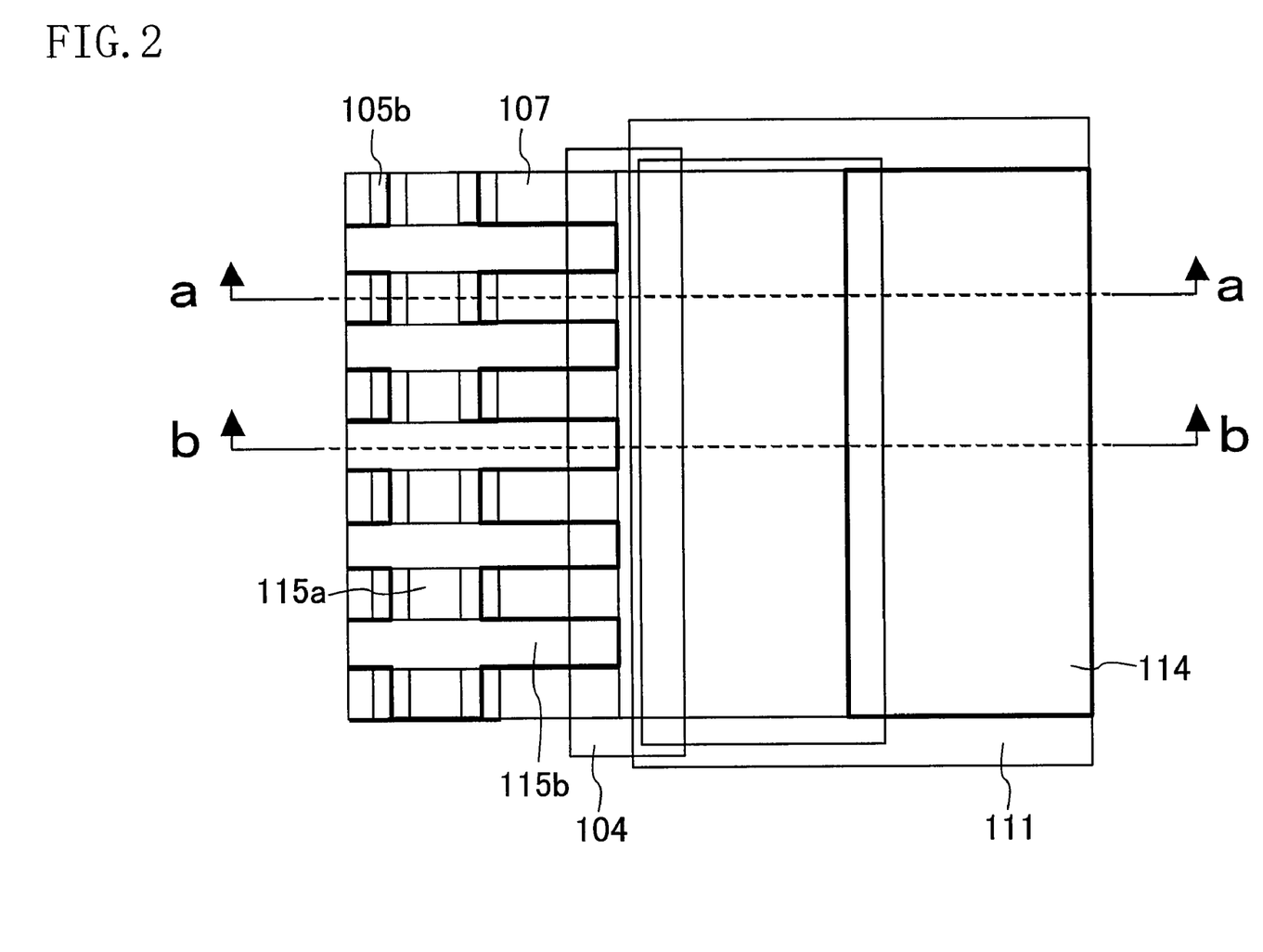
FIG. 2 is a plan view of a lateral high-voltage MOS transistor according to the embodiment.

The left drawing of FIG. 1A is a cross section of an N-type (second conductivity type) MOS region 201 and a P-type MOS region 202 which are included in the peripheral circuit. The right drawing of FIG. 1A is a cross section of a lateral high-voltage MOS transistor region 203 taken along the line a-a of the plan view of FIG. 2. FIG. 1B is a cross section taken along the line b-b of the plan view of FIG. 2.

As shown in the left drawing of FIG. 1A, an N-type well region 102 exists in the P-type semiconductor substrate 101 of the P-type MOS region 202. A gate insulating film 103 is provided on each of the P-type semiconductor substrate 101 and the N-type well region 102. A gate electrode 104 is provided on the respective insulating films 103. N-type source/drain regions 105a exist in the P-type semiconductor substrate 101 on both sides of the gate electrode 104 of the N-type MOS region 201. P-type source/drain regions 106 exist in the N-type well region 102 on both sides of the gate electrode 104 of the P-type MOS region 202. A drain electrode 118 and a source electrode 119 are connected to each of the N-type MOSFET and the P-type MOSFET structured as in the above.

As shown in the right drawing of FIG. 1A, an N-type low concentration drain region 111 exists in the P-type semiconductor substrate 101 of the lateral high-voltage MOS transistor region 203. An N-type low concentration source region 105b is spaced apart from this N-type low concentration drain region 111. A source electrode 117 of the lateral high-voltage transistor is provided on the P-type semiconductor substrate 101 so as to connect to the N-type low concentration source region 105b.

Further, an N-type high concentration source region 107 exists in part of the P-type semiconductor substrate 101 between the N-type low concentration drain region 111 and the N-type low concentration source region 105b, and is spaced apart from the N-type low concentration drain region 111 and adjacent to the N-type low concentration source region 105b. The N-type high concentration source region 107 has a diffusion depth deeper than that of the N-type low concentration source region 105b.

A channel region 113 exists in the substrate surface between the N-type low concentration drain region 111 and the N-type high concentration source region 107. A gate insulating film 103 is provided on the channel region 113, and a gate electrode 104 is provided on the gate insulating film 103. This means that the gate electrode 104 is insulated from the P-type semiconductor substrate 101 by the gate insulating film 103.

An N-type high concentration drain region 114 exists in the N-type low concentration drain region 111. A drain electrode 116 of the lateral high-voltage transistor is provided on the P-type semiconductor substrate 101 so as to connect to the N-type high concentration drain region 114.

In addition, a P-type substrate contact region 115a, spaced apart from the gate electrode 104, is provided so as to be in contact with a lower interface of the diffusion of the N-type low concentration source region 105b.

In the cross section of FIG. 1B taken along the line b-b of FIG. 2, a P-type substrate contact region 115b exists in the P-type semiconductor substrate 101, spaced apart from the N-type low concentration drain region 111. The P-type substrate contact region 115b is adjacent to the N-type high concentration source region 107 and the N-type low concentration source region 105b.

The N-type low concentration source region 105b has a diffusion depth that is equal to a diffusion depth of the N-type source/drain regions 105a of the N-type MOSFET.

According to the semiconductor device of the present embodiment, the saturation current of the lateral high-voltage MOS transistor region 203 substantially depends on the impurity concentration and the diffusion depth of the N-type high concentration source region 107. Hence, the saturation current is not less than a saturation current of a conventional structure if the impurity concentration and the diffusion depth of the N-type high concentration source region 107 are set to be almost equal to those of the conventional structure.

Since the P-type substrate contact region 115a is located under the N-type low concentration source region 105b, increase in substrate resistance is suppressed and the ESD tolerance and latch-up tolerance of the lateral high-voltage transistor are prevented from being lowered.

The N-type low concentration source region 105b has the same diffusion depth as that of the N-type source/drain regions 105a of the N-type MOSFET. Hence, the N-type source/drain regions 105a of the N-type MOSFET and the N-type low concentration source region 105b of the lateral high-voltage MOS transistor region 203 can be formed in the same step. This means no mask step for suppressing punch-through of the N-type MOSFET is needed. If the N-type source/drain regions 105a of the N-type MOSFET are formed to have a shallow diffusion depth to suppress punch-through, the N-type low concentration source region 105b will have a shallow diffusion depth, too. However, increase in on-resistance of the lateral high-voltage transistor can be suppressed by adjusting the impurity concentration and diffusion depth of the N-type high concentration source region 107 formed adjacent to the N-type low concentration source region 105b.

Since the N-type low concentration source region 105b is formed to have a shallow diffusion depth, it is possible to reduce the depth of the P-type substrate contact region 115a of the lateral high-voltage transistor. Hence, even in the case where the P-type substrate contact regions 115a and 115b and the P-type source/drain regions 106 are formed in the same step to have the same diffusion depth, the P-type source/drain regions 106 have a shallow diffusion depth to suppress punch-through. This means no mask step for suppressing punch-through of the P-type MOSFET is needed.

Thus, the semiconductor device of the present embodiment achieves a semiconductor device wherein a peripheral circuit composed of small MOS transistors and a lateral high-voltage transistor capable of suppressing the increase in on-resistance and having high ESD tolerance and latch-up tolerance are provided together without an increase in process cost.

Hereinafter, a method for fabricating a semiconductor device according to the present embodiment will be described with reference to FIG. 3 to FIG. 7. FIG. 3 to FIG. 7 are cross sections of the corresponding parts of FIG. 1.

Figure 3A:
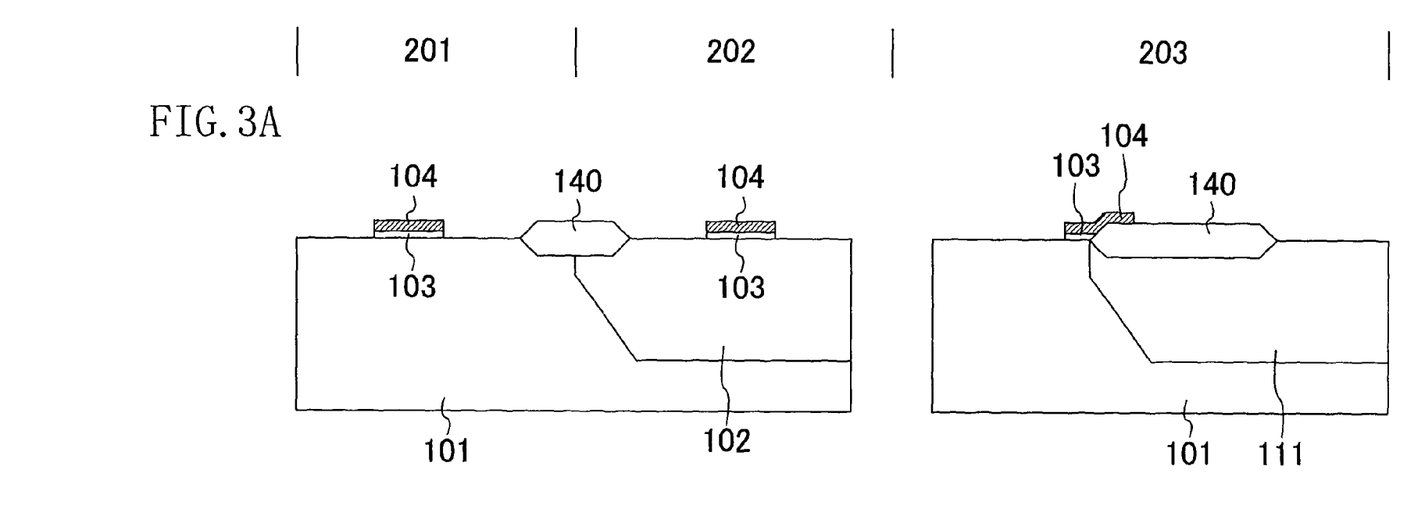
FIG. 3 shows cross sections illustrating a fabrication step of a semiconductor device according to the embodiment.
Figure 3B:
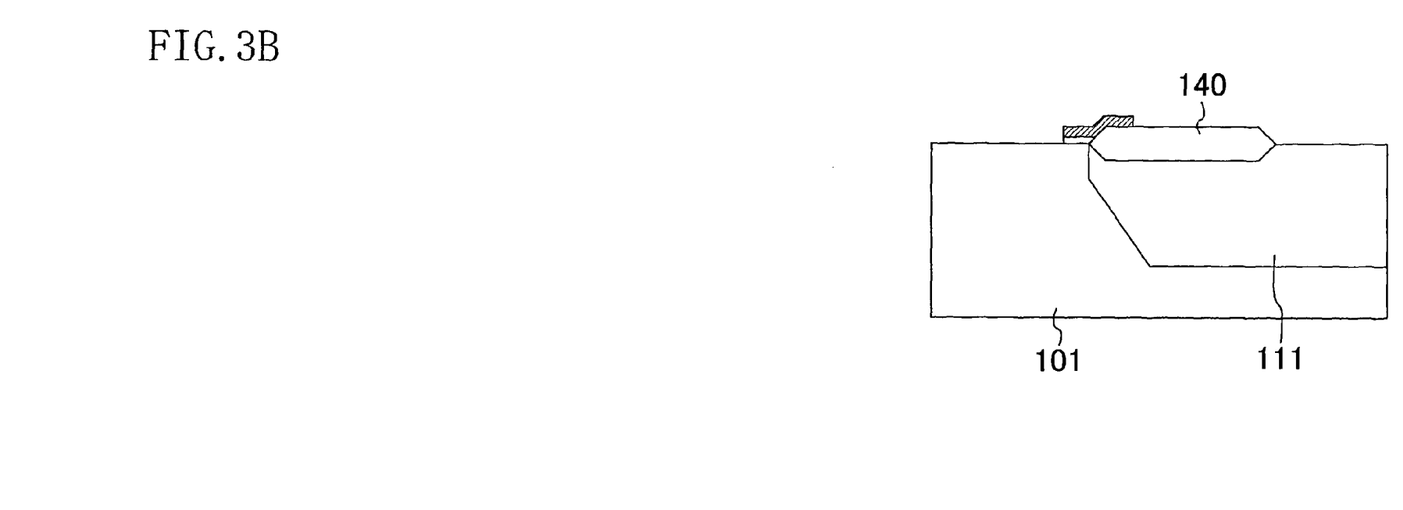

First, referring to FIG. 3, an N-type well region 102 is formed in a P-type semiconductor substrate 101 of a P-type MOS region 202, and an N-type low concentration drain region 111 is formed in the P-type semiconductor substrate 101 of a lateral high-voltage MOS transistor region 203 (Step (a)). Then, an isolation region 140 is selectively formed on the P-type semiconductor substrate 101 and the N-type low concentration drain region 111. After that, a gate insulating film 103 and an N-type conductor layer are formed on the P-type semiconductor substrate 101 in this order and the N-type conductor layer is patterned to obtain a desired gate electrode 104 (Step (b) to Step (d)).

Figure 4A:
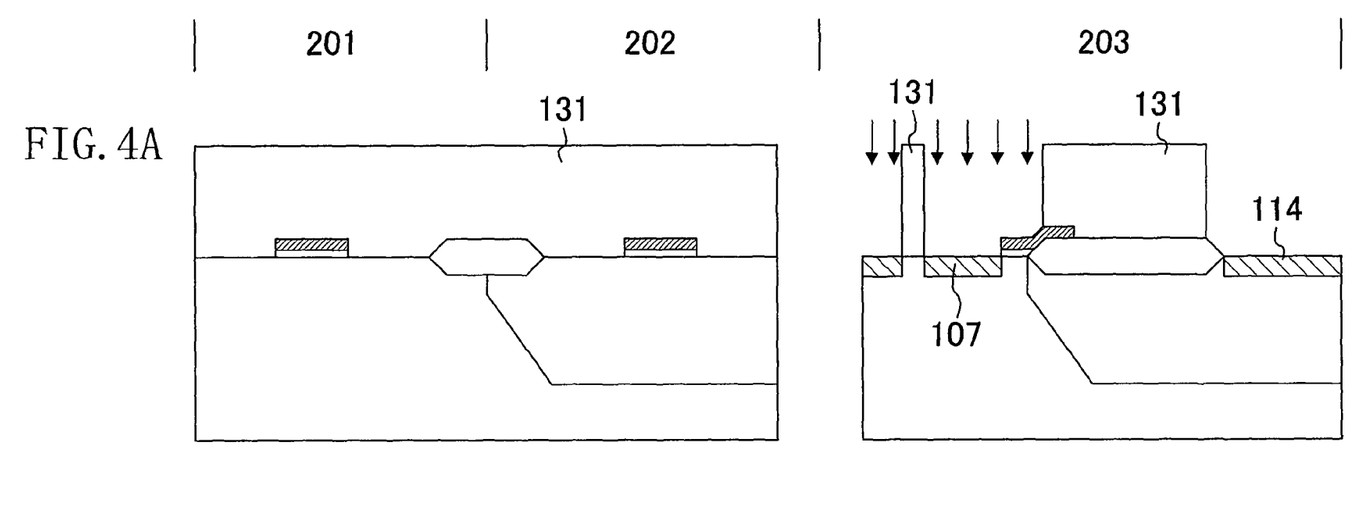
FIG. 4 shows cross sections illustrating a fabrication step of a semiconductor device according to the embodiment.
Figure 4B:
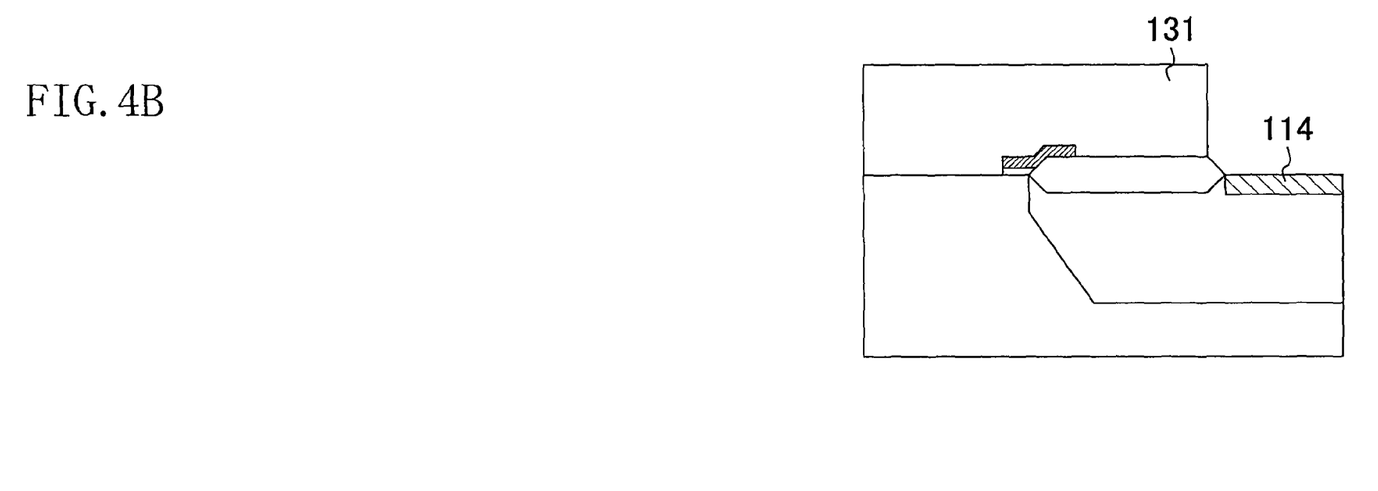

Next, referring to FIG. 4, arsenic ions are implanted at about 4E15/cm$^2$ to 1E16/cm$^2$ using a photoresist 131 as a mask, which has openings corresponding to an N-type high concentration drain region 114 and an N-type high concentration source region 107 of the lateral high-voltage MOS transistor region 203, and then, the photoresist 131 is removed. As a result, the N-type high concentration drain region 114 is formed in the N-type low concentration drain region 111, and the N-type high concentration source region 107 is formed in part of the P-type semiconductor substrate 101 such that the gate electrode 104 exists between the N-type high concentration drain region 114 and the N-type high concentration source region 107 (Step (e) and Step (f)).

Figure 5A:
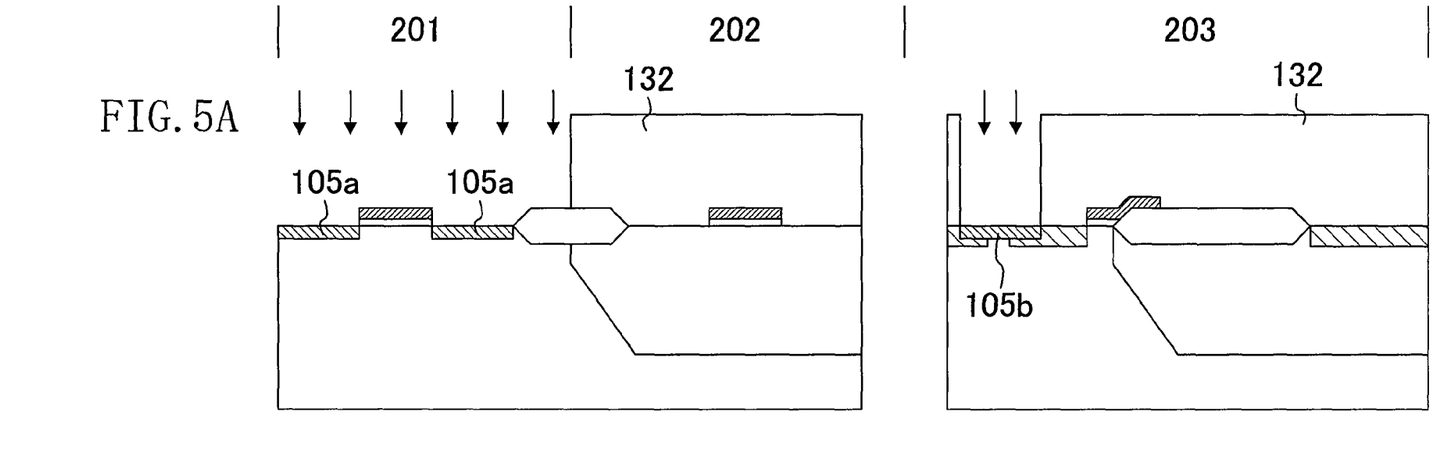
FIG. 5 shows cross sections illustrating a fabrication step of a semiconductor device according to the embodiment.
Figure 5B:
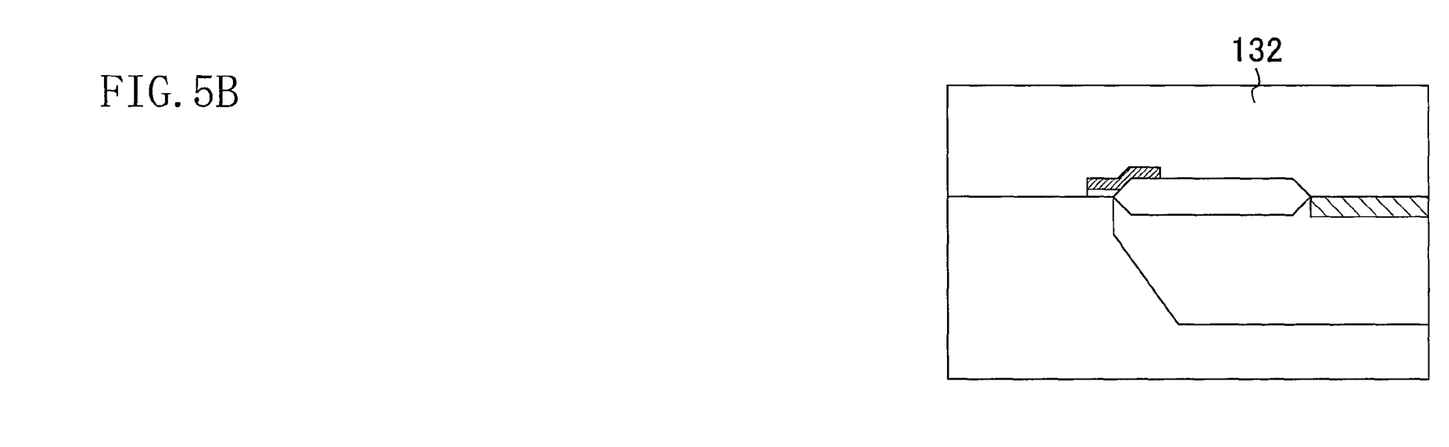

Next, referring to FIG. 5, arsenic ions are implanted at about 1E15/cm$^2$ to 3E15/cm$^2$ using a photoresist 132 as a mask, which has openings corresponding to N-type source/drain regions 105a of the N-type MOS region 201 and an N-type low concentration source region 105b of the lateral high-voltage MOS transistor region 203, and then, the photoresist 132 is removed. As a result, the N-type low concentration source region 105b having a diffusion depth shallower than the N-type high concentration source region 107 is formed adjacent to the N-type high concentration source region 107 and farther from the gate electrode 104 than the N-type high concentration source region 107. The N-type source/drain regions 105a are also formed in the N-type MOS region 201 (Step (g) and Step (i)).

Figure 6A:
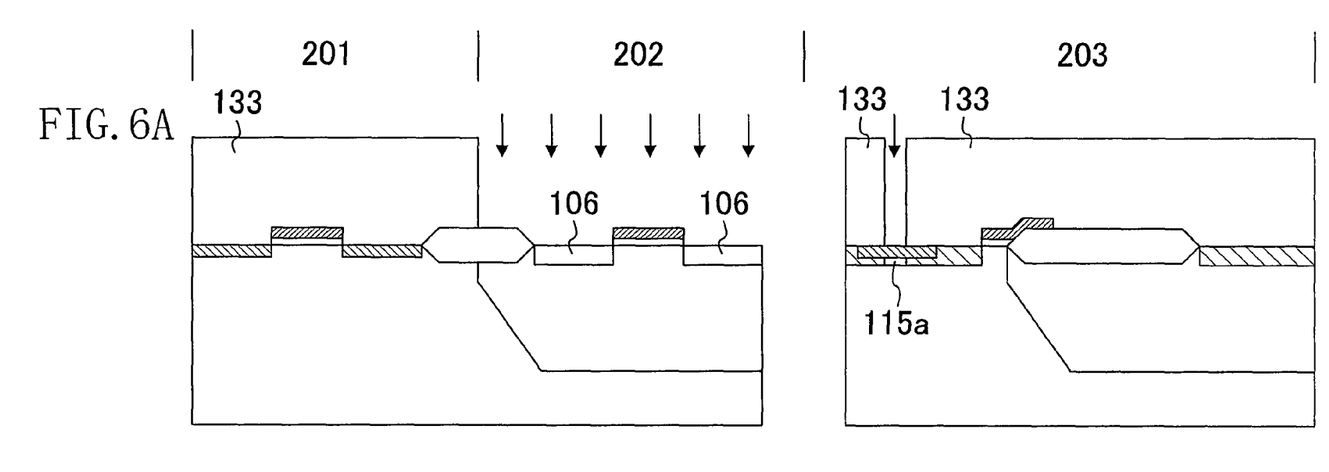
FIG. 6 shows cross sections illustrating a fabrication step of a semiconductor device according to the embodiment.
Figure 6B:
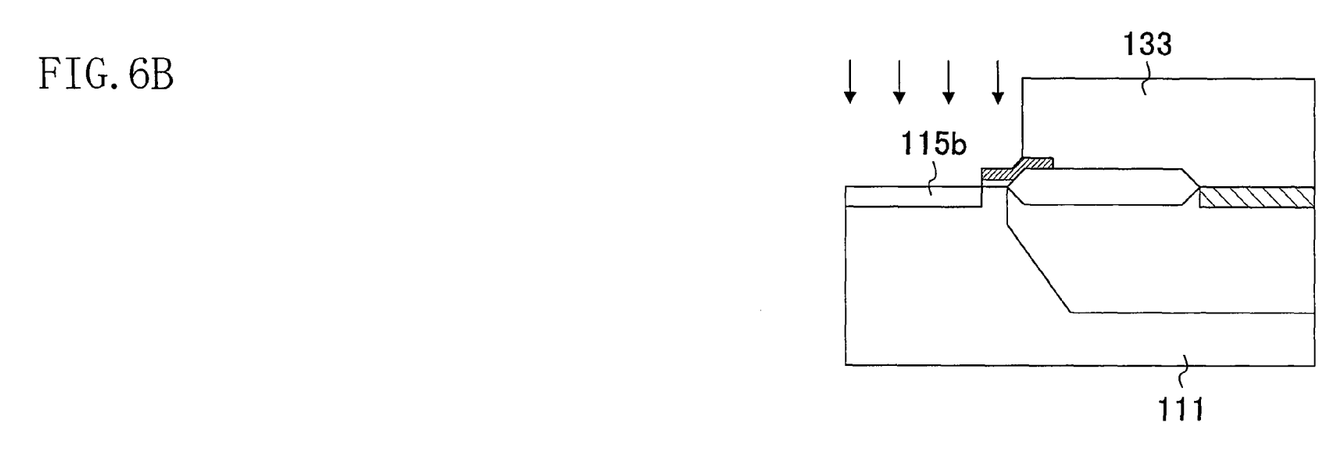

Next, referring to FIG. 6, boron ions are implanted at about 1E15/cm$^2$ to 5E15/cm$^2$ using a photoresist 133 as a mask, which has openings corresponding to P-type source/drain regions 106 of the P-type MOS region 202 and P-type substrate contact regions 115a and 115b of the lateral high-voltage MOS transistor region 203, and then, the photoresist 133 is removed. After that, a thermal treatment is carried out at a temperature of about 900° C. to 1000° C. for impurity diffusion. As a result, the P-type substrate contact region 115b is formed adjacent to the N-type low concentration source region 105b, and the P-type substrate contact region 115a is formed so as to be in contact with part of the lower interface of the diffusion of the N-type low concentration source region 105b, in other words, so as to overlap with part of N-type low concentration source region 105b. The P-type source/drain regions 106 are also formed in the P-type MOS region 202 (Step (h) and Step (j)).

Figure 7A:
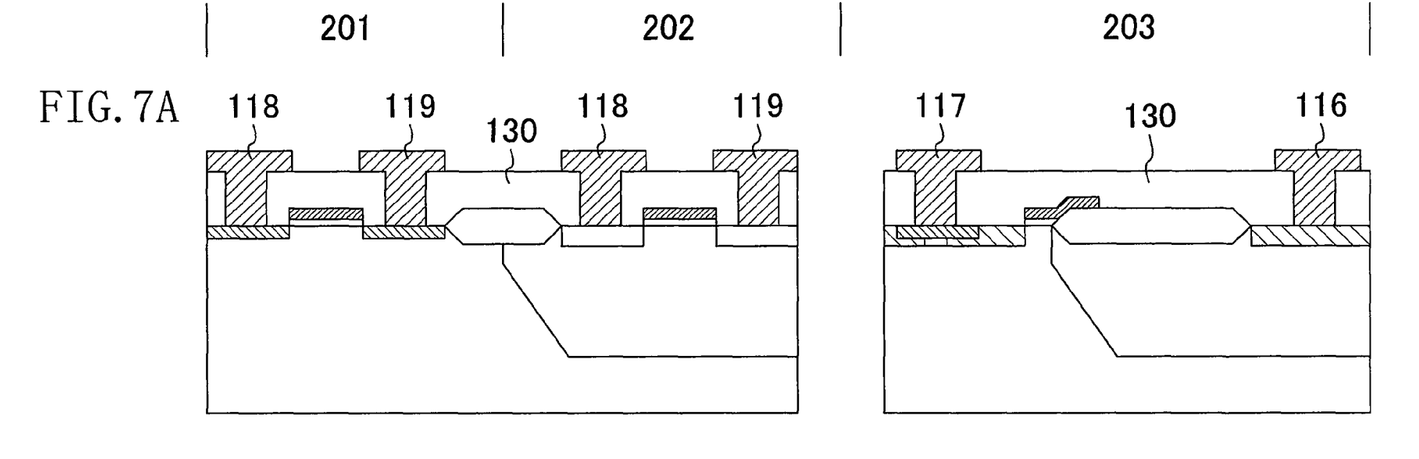
FIG. 7 shows cross sections illustrating a fabrication step of a semiconductor device according to the embodiment.
Figure 7B:
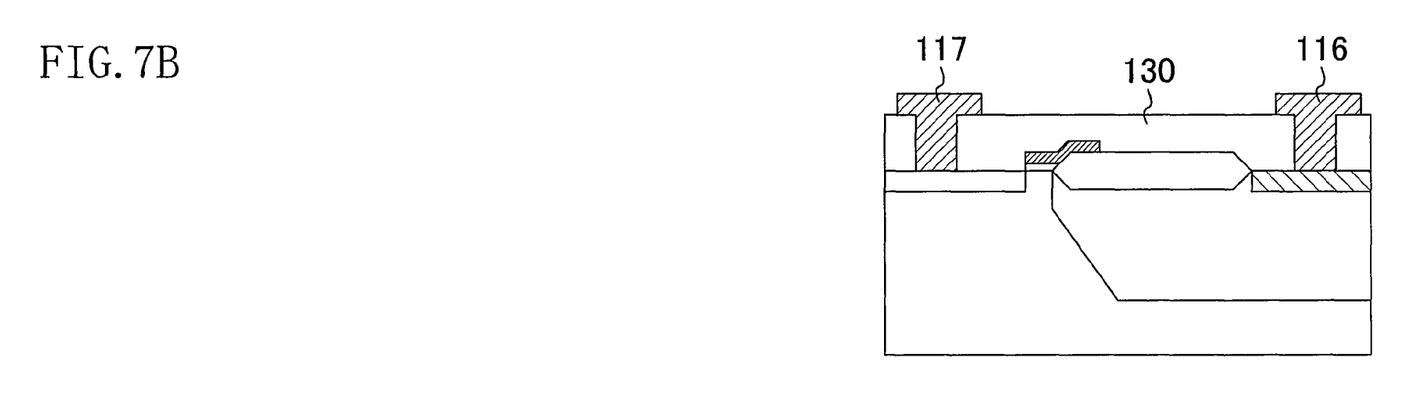

Next, referring to FIG. 7, an insulating film 130 is formed, and openings are formed in the insulating film 130 using a known technique and an electrode is formed in each of the openings. As a result, a semiconductor device having the structure of FIG. 1 can be obtained.

According to the above method of the present embodiment, the N-type source/drain regions 105a of the N-type MOSFET and the N-type low concentration source region 105b of the lateral high-voltage MOS transistor region 203 are formed in the same step, and the P-type source/drain regions 106 of the P-type MOSFET and the P-type substrate contact regions 115a and 115b are formed in the same step.

In the above description, ions are first implanted in the N-type high concentration drain region 114 and N-type high concentration source region 107 of the lateral high-voltage MOS transistor region 203, then in the N-type source/drain regions 105a of the N-type MOS region 201 and the N-type low concentration source region 105b of the lateral high-voltage MOS transistor region 203, and lastly in the P-type source/drain regions 106 of the P-type MOS region 202 and the P-type substrate contact regions 115a and 115b of the lateral high-voltage MOS transistor region 203. However, the order of ion implantation is not limited to the above order but may be changed as necessary.

As explained in the above, the semiconductor device and the semiconductor device fabrication method of the present invention achieve an effect of making it possible to provide, at a low cost, a semiconductor device in which a peripheral circuit and a lateral high-voltage transistor capable of suppressing on-resistance and having high ESD tolerance and latch-up tolerance are provided together, and are useful as, for example, a semiconductor device in which a high-voltage transistor and a peripheral circuit are provided together and a method for fabricating the same.

What is claimed is:

1. A semiconductor device comprising a first conductivity type semiconductor substrate, a high-voltage transistor and a peripheral circuit which includes a second conductivity type MOSFET, the high-voltage transistor and the peripheral circuit being provided together on the first conductivity type semiconductor substrate, wherein the high-voltage transistor includes:

a low concentration drain region of a second conductivity type formed in the semiconductor substrate;

a low concentration source region of a second conductivity type formed in the semiconductor substrate and spaced apart from the low concentration drain region;

a high concentration source region of a second conductivity type formed in part of the semiconductor substrate that is between the low concentration drain region and the low concentration source region, the high concentration source region being spaced apart from the low concentration drain region and adjacent to the low concentration source region and having a diffusion depth deeper than that of the low concentration source region;

a gate electrode formed above the semiconductor substrate between the low concentration drain region and the high concentration source region so as to be insulated from the semiconductor substrate;

a high concentration drain region of a second conductivity type formed in the low concentration drain region;

a drain electrode formed on the semiconductor substrate so as to connect to the high concentration drain region;

a substrate contact region of a first conductivity type formed so as to be at least in contact with a lower interface of the low concentration source region; and a source electrode formed on the semiconductor substrate so as to connect to the low concentration source region, and wherein a diffusion depth of the low concentration source region is equal to that of source/drain regions of the MOSFET.

2. The semiconductor device of claim 1, wherein the peripheral circuit further includes a first conductivity type MOSFET.

* * * * *